United States Patent
Campos et al.

(10) Patent No.: US 9,870,947 B1
(45) Date of Patent: Jan. 16, 2018

(54) METHOD FOR COLLECTIVE (WAFER-SCALE) FABRICATION OF ELECTRONIC DEVICES AND ELECTRONIC DEVICE

(71) Applicants: STMicroelectronics (Grenoble 2) SAS, Grenoble (FR); STMicroelectronics SA, Montrouge (FR); Commissariat A L'Energie Atomique et aux Energies Alternatives, Paris (FR)

(72) Inventors: Didier Campos, Charavines (FR); Benoit Besancon, Villard Bonnot (FR); Perceval Coudrain, Grenoble (FR); Jean-Philippe Colonna, Corenc (FR)

(73) Assignees: STMicroelectronics (Grenoble 2) SAS, Grenoble (FR); STMicroelectronics SA, Montrouge (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/632,878

(22) Filed: Jun. 26, 2017

(30) Foreign Application Priority Data

Jul. 1, 2016 (FR) ...................... 16 56331

(51) Int. Cl.
*H01L 23/29* (2006.01)
*H01L 21/78* (2006.01)
(Continued)

(52) U.S. Cl.
CPC .............. *H01L 21/78* (2013.01); *H01L 21/56* (2013.01); *H01L 23/373* (2013.01);
(Continued)

(58) Field of Classification Search
CPC ... H01L 21/6836; H01L 23/29; H01L 23/373; H01L 21/782
(Continued)

(56) References Cited

U.S. PATENT DOCUMENTS

2006/0128065 A1* 6/2006 Inada .................... C09J 7/0242
                                                              438/118
2008/0308223 A1* 12/2008 Sakairi ................... B29C 43/18
                                                              156/275.5
(Continued)

FOREIGN PATENT DOCUMENTS

| CN | 2598137 Y  | 1/2004 |
| EP | 1120830 A2 | 8/2001 |
| EP | 2760044 A1 | 7/2014 |

OTHER PUBLICATIONS

INPI Search Report and Written Opinion for FR 1656331 dated Mar. 28, 2017 (9 pages).

*Primary Examiner* — George Fourson, III
(74) *Attorney, Agent, or Firm* — Gardere Wynne Sewell LLP (57) ABSTRACT

Electronic devices are manufactured using a collective (wafer-scale) fabrication process. Electronic chips are mounted onto one face of a collective substrate wafer. A collective flexible sheet made of a heat-conductive material comprising a layer containing pyrolytic graphite is fixed to extend over a collective region extending over the electronic chips and over the collective substrate wafer between the electronic chips. The collective flexible sheet is then compressed. A dicing operation is then carried out in order to obtain electronic devices each including an electronic chip, a portion of the collective plate and a portion of the collective flexible sheet.

19 Claims, 4 Drawing Sheets

(51) Int. Cl.
*H01L 21/56* (2006.01)
*H01L 23/373* (2006.01)
*H01L 23/00* (2006.01)
*H01L 21/782* (2006.01)
*H01L 21/683* (2006.01)

(52) U.S. Cl.
CPC ........ *H01L 23/562* (2013.01); *H01L 21/6836* (2013.01); *H01L 21/782* (2013.01); *H01L 23/29* (2013.01)

(58) Field of Classification Search
USPC .......................................... 257/796; 438/465
See application file for complete search history.

(56) References Cited

U.S. PATENT DOCUMENTS

| | | | |
|---|---|---|---|
| 2011/0019370 A1* | 1/2011 | Koh ...................... | H01L 21/561 361/749 |
| 2011/0070436 A1* | 3/2011 | Nguyen ................. | C09J 153/00 428/355 EP |
| 2013/0011999 A1* | 1/2013 | Yun ........................ | H01L 21/78 438/462 |
| 2014/0091348 A1* | 4/2014 | Katayama ............... | H01L 21/56 257/98 |
| 2015/0130047 A1* | 5/2015 | Tseng .................. | H01L 23/3736 257/713 |
| 2016/0133541 A1 | 5/2016 | Ozawa et al. | |
| 2016/0133579 A1* | 5/2016 | Akiba ................... | H01L 23/552 257/659 |

\* cited by examiner

METHOD FOR COLLECTIVE (WAFER-SCALE) FABRICATION OF ELECTRONIC DEVICES AND ELECTRONIC DEVICE

PRIORITY CLAIM

This application claims the priority benefit of French Application for Patent No. 1656331, filed on Jul. 1, 2016, the disclosure of which is hereby incorporated by reference in its entirety.

TECHNICAL FIELD

The present invention relates to the field of electronic devices including electronic chips of integrated circuits.

BACKGROUND

In operation, some electronic chips produce heat that needs to be evacuated. In certain cases, this production of heat is local and leads to a local and undesirable rise in the temperature.

Currently, a known solution is to equip electronic devices with metal plates, generally made of copper, and potentially to add radiators to them.

Nevertheless, such metal plates do not prevent an excessive local rise in the temperature of the electronic chips because the diffusion of the heat essentially takes place in the direction of the thickness of the metal plates. Moreover, during manufacturing, the metal plates are installed individually onto the electronic chips.

There is a need in the art to improve the evacuation of the heat produced, in particular locally, by the electronic chips and to enable a collective (wafer-scale) fabrication of electronic devices.

SUMMARY

According to one embodiment, a method is provided for collective (wafer-scale) fabrication of electronic devices.

The method comprises the following steps: a) mounting a plurality of electronic chips onto a mounting face of a collective substrate wafer, separated from one another and on location sites, b) extending a collective flexible sheet comprising at least one layer of a heat-conductive material, containing graphite, over a collective region running over the electronic chips and over the mounting face of the collective substrate wafer, between the electronic chips, c) compressing the collective flexible sheet in the direction of the collective region, and d) carrying out a dicing in order to obtain electronic devices respectively comprising at least one of the electronic chips, a portion of the collective substrate wafer corresponding to one location site and a portion of the collective flexible sheet corresponding to this location site.

The graphite of the flexible sheet may be pyrolytic (PGS—pyrolytic graphite sheet).

The method may comprise the following step between the step a) and the step b): forming a collective encapsulation block that fills, at least in part, the gaps between the electronic chips, the collective region comprising at least a part of the back faces of the electronic chips and a back face of the collective encapsulation block.

The method may comprise the following step between the step a) and the step b): forming encapsulation rings respectively running around the electronic chips and on top of the mounting face of the substrate wafer, the collective region comprising at least a part of the back faces of the electronic chips, at least a part of the back faces of the encapsulation rings and at least a part of the mounting face of the collective substrate wafer running between the encapsulation rings.

The method may comprise the following step after the step b) or the step c): forming a collective encapsulation block on top of the flexible sheet.

The method may comprise the following step after the step b) or the step c): forming a collective protective layer on top of the collective flexible sheet.

The method may comprise the following step between the steps a) and b): forming a collective protective layer on top of the region.

The method may comprise the following step between the steps a) and b): forming a collective protective layer on top of the region.

The collective flexible sheet to be spread out may comprise the layer containing graphite and a protective layer.

The collective flexible sheet to be spread out may comprise the layer containing graphite interposed between two protective layers.

The protective layer or protective layers can exhibit a hardness greater than the hardness of the layer containing graphite.

The method may comprise the following step: fixing the collective flexible sheet on top of the collective region using a collective layer of adhesive.

An electronic device is also provided which comprises: a substrate wafer having a mounting face, at least one electronic chip one front face of which is mounted on the mounting face of the substrate wafer, and a flexible layer comprising at least one layer of a heat-conductive material, containing graphite, the flexible layer being situated on a region extending over a back face of the electronic chip and on top of the mounting face of the substrate wafer, around the electronic chip.

The flexible layer may comprise a layer of pyrolytic graphite (PGS).

A layer of adhesive may be interposed between the flexible layer and the region.

A protective layer may be provided on top of the layer containing graphite.

A protective layer may be provided underneath the layer containing graphite.

The protective layer or protective layers can exhibit a hardness greater than the hardness of the layer containing graphite.

The device may comprise an encapsulation block around the electronic chip and between the mounting face of the substrate wafer and the flexible layer, the region comprising the back face of the electronic chip and a back face of the encapsulation block.

The device may comprise an encapsulation ring running around the electronic chip and over the mounting face of the substrate wafer, the region comprising the back face of the electronic chip, a back face of the encapsulation ring and a part of the mounting face of the substrate wafer surrounding the encapsulation ring.

The device may comprise an encapsulation block on top of the flexible layer.

BRIEF DESCRIPTION OF THE DRAWINGS

Electronic devices and fabrication modes for the latter will now be described by way of exemplary embodiments, illustrated by the drawings in which.

DETAILED DESCRIPTION

Figure 1:
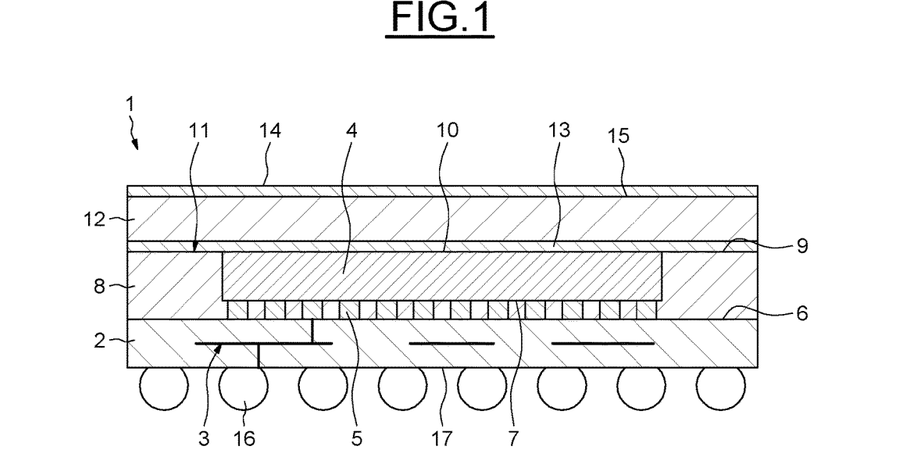
FIG. 1 shows a cross-section of an electronic device.

As illustrated in FIG. 1, an electronic device 1 comprises a carrier wafer 2 on an insulating substrate, including a network of electrical connections 3.

The electronic device 1 comprises an electronic chip of integrated circuits 4 mounted onto the carrier wafer 2 by means of a plurality of electrical connection elements 5, such as metal beads or pillars, interposed between a mounting face 6 of the carrier wafer 2 and a front face 7 of the electronic chip 4. The electrical connection elements 5 are connected, on the one hand, to the network of electrical connections 3 of the carrier wafer 2 and, on the other hand, to the integrated circuits of the electronic chip 4.

The electronic device 1 also comprises an intermediate encapsulation block 8, for example made of an epoxy resin, extending over the mounting face 6 of the carrier wafer 2 and surrounding the electronic chip 4 as far as the outer edge of the carrier wafer 2.

According to one variant embodiment, the encapsulation block 8 has a back face 9 which extends coplanar with a back face 10 of the electronic chip 4 opposite to the front face 7, so as to form a back region 11 parallel to the mounting face 6 of the substrate wafer 2.

According to another variant embodiment, the encapsulation block 8 can cover the back face 10 of the electronic chip 4, such that the back region 11 is formed only by the back face of the encapsulation block 8.

The electronic device 1 comprises a back layer 12 of a flexible material in the form of a heat-conductive sheet which extends over the region 11 and which is fixed onto the region 11 using a thin layer of heat-conductive adhesive 13. For example, the layer of adhesive 13 may be of the silicone or polyimide or epoxy type and its thickness can be in the range between one and thirty microns. The heat-conductive layer 12 extends as far as the outer edge of the encapsulation block 8. In one variant embodiment, the conductive flexible layer 12 could be fixed by compression, without an adhesive layer, potentially with interposition of a thin metal sheet (for example made of copper).

The flexible heat-conductive layer 12 contains graphite. Advantageously, this layer 12 comprises a pyrolytic graphite (PGS). Its thickness can be in the range between five microns and a millimeter.

The electronic device 1 further comprises an external back protective layer 14 which covers one face 15 of the heat-conductive layer 12, turned towards the outside. The face 15 of the layer 12 is opposite to the face of the layer 12 in contact with the adhesive. This external layer 14 exhibits a hardness greater than the hardness of the heat-conductive layer 12 (which is made of pyrolytic graphite), and thus allows this layer 12 to be protected against pressures and impacts. The external protective layer 14 is, for example, a layer of polyimide adhering to the flexible sheet and its thickness can be between five and thirty microns. The electronic device 1 takes the form of a parallelepiped with a square or rectangular base.

The electronic device 1 further comprises external electrical connection elements 16 placed on the outer face 17 of the carrier wafer 2 opposite to its mounting face 6. The elements 16 are connected to the network of electrical connections 3.

By virtue of the heat-conductive layer 12 made of a pyrolytic graphite, the heat produced by the electronic chip 4, generally locally, diffuses into this layer 12 in every direction parallel to the region 11, in other words perpendicularly to the thickness of this layer 12, in such a manner that the face 15 turned towards the outside of the heat-conductive layer 12 diffuses the heat towards the outside virtually uniformly over its whole surface. Thus, a local excessive rise in the temperature of the electronic chip 4 can be avoided since the evacuation of the heat produced is improved.

The electronic device 1 is produced by collective (wafer-scale) fabrication which will now be described.

Figure 2:
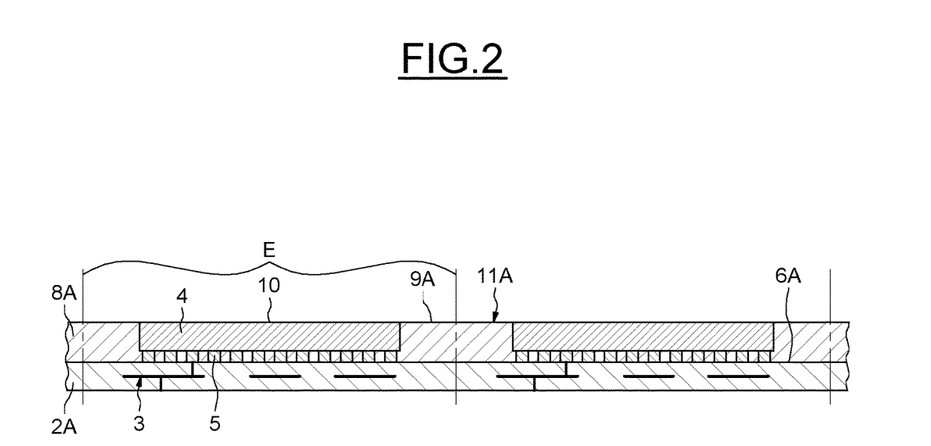
FIGS. 2 to 4 show cross-sections illustrating a method of fabricating the electronic device in FIG. 1.

As illustrated in FIG. 2, a substrate wafer 2A is provided including a plurality of electrical connection networks 3, respectively provided in adjacent location sites E, for example with square or rectangular contours, disposed according to a matrix, each location site E corresponding to an electronic device 1 to be fabricated.

An electronic chip 4 has been installed on a mounting face 6A of the substrate wafer 2A, in each of the location sites E, these chips being separated from one another, by means of electrical connection elements 5.

On the mounting face 6A of the substrate wafer 2A and in the gaps separating the electronic chips 4, a collective encapsulation block 8A has been formed, for example using an epoxy resin. As an initial step, an encapsulation material, also an epoxy resin, may be injected between each of the electronic chips 4 and the substrate wafer 2A.

According to one variant embodiment, the collective encapsulation block 8A surrounds the electronic chips 4 and has a back face 9A which extends coplanar with the back faces 10 of the electronic chips 4, in order to form a flat back collective region 11A parallel to the mounting face 6A of the substrate wafer 2A.

According to another variant embodiment, the collective encapsulation block 8A may furthermore cover the back faces 10 of the electronic chips 4, in such a manner that the back collective region 11A is formed only by the back face 9A of the encapsulation block 8A.

Figure 3:
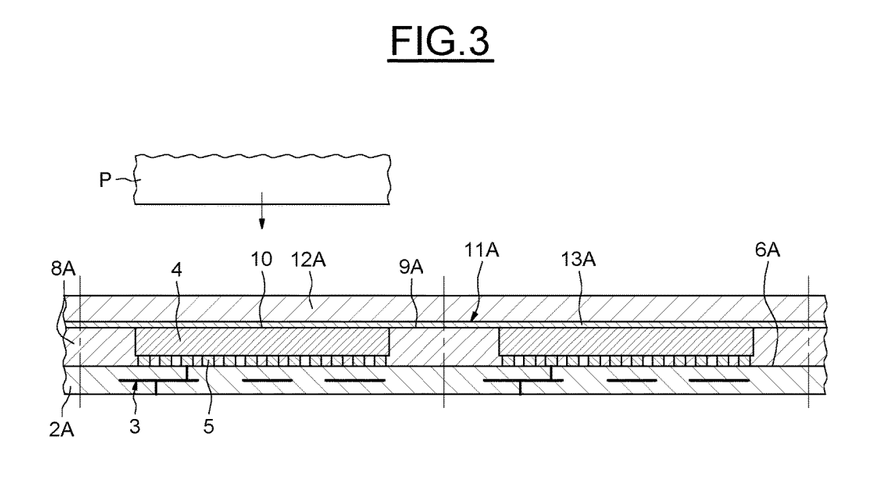

As illustrated in FIG. 3, a thin collective layer of adhesive 13A has been spread over the back collective region 11A. The collective layer of adhesive 13A may be of the silicone or polyimide or epoxy type and its thickness can be in the range between five and thirty microns.

Then, a collective flexible sheet 12A, made of pyrolytic graphite, has been extended over the collective layer of adhesive 13A. The thickness of this collective flexible sheet 12A can be in the range between five and two hundred microns.

Subsequently, a heating step has been carried out and the collective sheet 12A has been pressed in the direction of the back collective region 11A, by means of a tool P such as a pressing plate or a roller, in order to ensure the adhesive bonding and in such a manner that the collective flexible sheet 12A conforms to the topography of the back collective region 11A.

Figure 4:
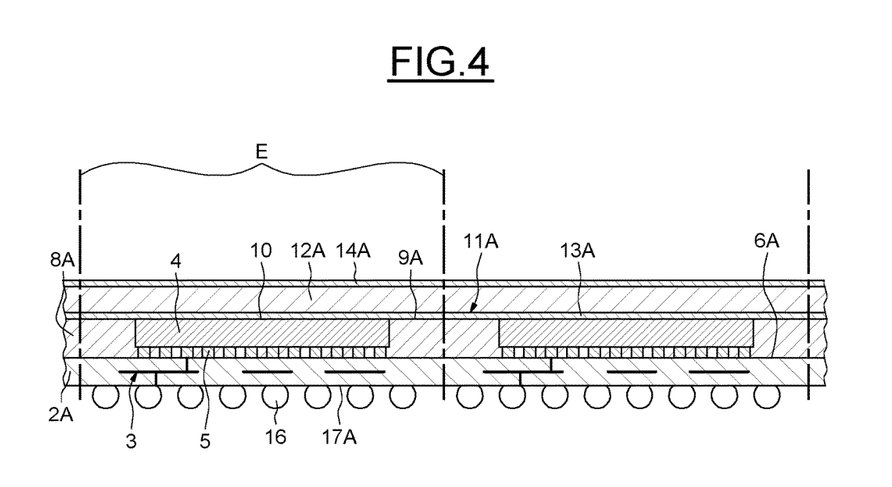

As illustrated in FIG. 4, a collective protective layer 14A has been deposited onto the adhesively bonded collective sheet 12A. The collective protective layer 14A may be a polyimide adhering to the flexible sheet 12A and its thickness can be between five and thirty microns.

Then, electrical connection elements 16 have been installed on the face 17A of the substrate wafer 2A, opposite to its mounting face 6A, the electrical connection elements 16 being respectively connected to the electrical connection networks 3.

Subsequently, a dicing is carried out, perpendicularly to the collective substrate wafer 2A and along rows and columns of the matrix of location sites E, through the collective substrate wafer 2A, the collective encapsulation block 8A, the collective layer of adhesive 13A, the collective sheet 12A and the collective protective layer 14A, the material of the flexible sheet 12A not constituting an obstacle for this dicing.

Thus, a plurality of electronic devices 1 is obtained, each taking the form of a parallelepiped and comprising an electronic chip 4, a portion of the collective substrate wafer 2A, a portion of the collective encapsulation block 8A, a portion of the heat-conductive layer 14A, a portion of the collective layer of adhesive 13A and a portion of the collective protective layer 14A, corresponding to the location sites E.

According to one variant embodiment, prior to being spread out, the collective flexible sheet 12A may be coated on one face with the back protective layer 14A, so as to form a multilayer collective sheet to be spread out on top of the back collective region 11A.

According to another variant embodiment, prior to being spread out, the collective flexible sheet 12A may be interposed between the back protective layer 14A on one face and a protective layer on its other face, so as to form a multilayer collective flexible sheet to be spread out on top of the back collective region 11A.

Figure 5:
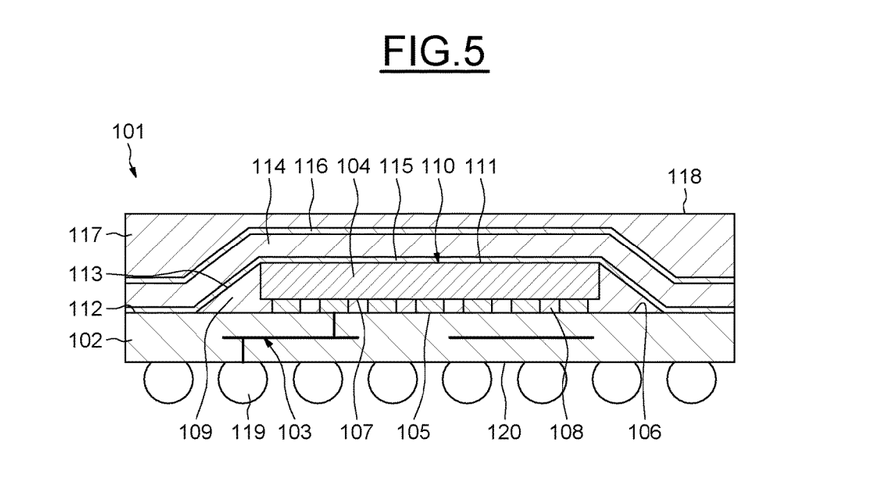
FIG. 5 shows a cross-section of another electronic device.

As illustrated in FIG. 5, an electronic device 101 comprises a carrier wafer 102 on an insulating substrate, including a network of electrical connections 103.

The electronic device 101 comprises an electronic chip of integrated circuits 104 mounted onto the carrier wafer 102 by means of a plurality of electrical connection elements 105 such as beads or metal pillars, interposed between a mounting face 106 of the carrier wafer 102 and a front face 107 of the electronic chip 104. The electrical connection elements 105 are connected, on the one hand, to the network of electrical connections 103 of the carrier wafer 102 and, on the other hand, to the integrated circuits of the electronic chip 104.

The electronic device 101 comprises an encapsulation material 108 on the mounting face 106 of the carrier wafer 102, which fills the gap between the carrier wafer 102 and the electronic chip 104 and which forms an encapsulation ring 109 that fills the corner between the carrier wafer 102 and the periphery of the electronic chip 104. The encapsulation ring 109 does not reach the periphery of the carrier wafer 102 and forms an intermediate encapsulation block.

Thus, a back region 110 is defined which comprises the back face 111 of the chip 104, the peripheral portion 112 of the mounting face 106 of the carrier wafer 102 (which surrounds the encapsulation ring 109) and the back face 113 of this encapsulation ring 109.

The electronic device 101 comprises a back layer 114 of a flexible material, being heat-conductive, which extends over the region 110 and which is fixed onto the latter by a thin layer of heat-conductive adhesive 115. The heat-conductive layer 114 extends up to the outer edge of the carrier wafer 102 and takes the form of a bowl or of a cavity inside of which the electronic chip 104 and the encapsulation ring 109 are situated. In other words, a part of the layer 114 conforms, more or less substantially, to the shape of the chip 104. The heat-conductive layer 114 contains graphite, advantageously a pyrolytic graphite (PGS).

The electronic device 101 comprises an optional protective layer 116 which covers the back layer 114, at least in part.

The electronic device 101 furthermore comprises an external back encapsulation block 117 which covers at least the peripheral portion of the protective layer 116 and which extends as far as the outer edge of the heat-conductive layer 114, in such a manner that the encapsulation block 117 has an external back face 118 parallel to the carrier wafer 102. The electronic device 101 takes the form of a parallelepiped, with a square or rectangular base.

The protective layer 116 and/or the encapsulation block 117 have a hardness greater than the hardness of the heat-conductive layer 114 (which is made of pyrolytic graphite), and thus allow this layer 114 to be protected against pressures and impacts.

The electronic device 101 furthermore comprises external electrical connection elements 119 placed on the external face 120 of the carrier wafer 102 opposite to its mounting face 106, these elements 119 being connected to the network of electrical connections 103.

As in the case of the preceding example, by virtue of the heat-conductive layer 114 made of a pyrolytic graphite, the heat produced by the electronic chip 104, generally locally, diffuses into this layer 114 parallel to the region 110 in all directions, in other words perpendicularly to the thickness of this layer 114, so that the face turned towards the outside of the heat-conductive layer 114 diffuses the heat towards the outside virtually uniformly over its whole surface, through the encapsulation block 117. Thus, an excessive local rise in the temperature of the electronic chip 104 can be avoided because the evacuation of the heat produced is improved.

The electronic device 101 is produced by a collective (wafer-scale) fabrication that will now be described.

Figure 6:
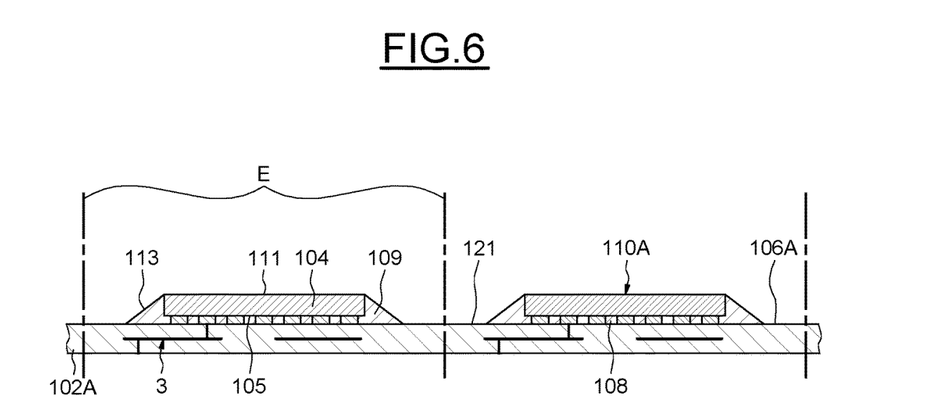
FIGS. 6 to 8 show cross-sections illustrating a fabrication method for the electronic device in FIG. 5.

As illustrated in FIG. 6, a substrate wafer 102A is provided including a plurality of electrical connection networks 103, respectively provided in adjacent location sites E, for example with square or rectangular contours, disposed according to a matrix. Each location site E corresponds to one electronic device 101 to be fabricated.

An electronic chip 104 is installed on a mounting face 106A of the substrate wafer 102A, in each of the location sites E, separated from one another by means of electrical connection elements 105.

An encapsulation material 108 has been introduced into the gaps between each of the chips 104 and the mounting face 106A of the substrate wafer 102A. At the same time, encapsulation rings 109 have been formed around the electronic chips 104 on the mounting face 106A of the substrate wafer 102A.

A non-flat back collective region 110A is then formed which comprises the back faces 111 of the electronic chips 104, the back faces 113 of the encapsulation rings 109 and the collective portions 121 of the mounting face 106A of the substrate wafer 102A which extend between the encapsulation rings 109, over the gaps between the chips 104.

Figure 7:
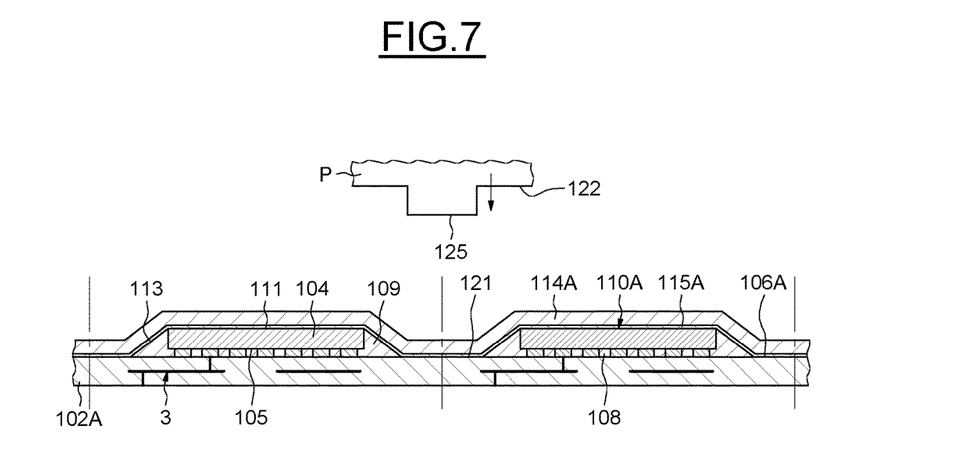

As illustrated in FIG. 7, a thin collective layer of adhesive 115A has been spread over the back collective region 110A.

Then, a collective flexible sheet 114A, of pyrolytic graphite, has been extended over the layer of adhesive 115A.

Subsequently, the assembly has been heated and the sheet 114A has been pressed in the direction of the back collective region 110A, by means of a tool P, in such a manner that the collective flexible sheet 114A espouses the topography of the collective region 110A. This tool P advantageously takes the form of a waffling with recessed faces 122 situated opposite the back faces 111 of the chips 104 and protruding faces 123 situated opposite the collective portions 121 of the substrate wafer 102A.

Figure 8:
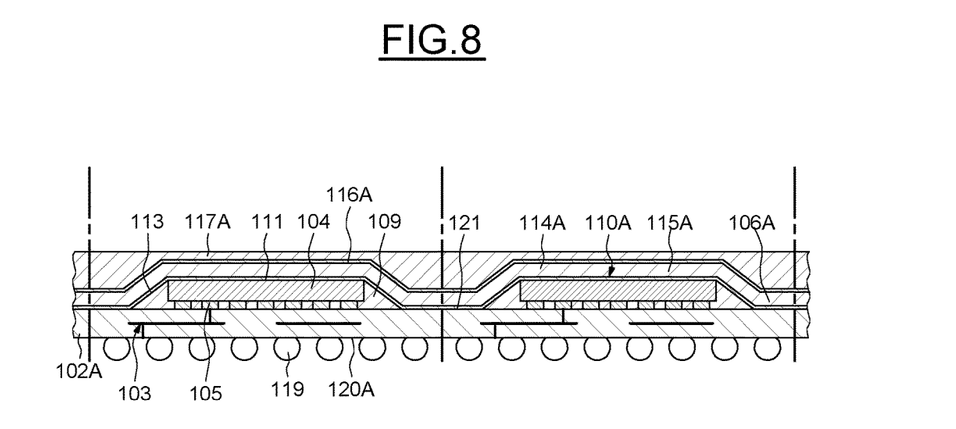

As illustrated in FIG. 8, a collective protective layer 116A has been formed on the bonded collective flexible sheet 114A.

Then, a collective encapsulation block 117A, for example of an epoxy resin, has been formed on the collective protective layer 116A.

Then, electrical connection elements 119 have been installed on the face 120A of the substrate wafer 102A, opposite to its mounting face 106A, the electrical connection elements 119 being respectively connected to the electrical connection networks 3.

Subsequently, a dicing is carried out, perpendicularly to the collective substrate wafer 102A and along the rows and the columns of the matrix of location sites E, through the collective substrate wafer 102A, the collective layer of adhesive 115A, the collective sheet 114A, the collective protective layer 116A and the collective encapsulation block 117A.

A plurality of electronic devices 101 is thus obtained, each taking the form of a parallelepiped and comprising an electronic chip 104, an encapsulation ring 109, a portion of the collective substrate wafer 102A, a portion of the heat-conductive layer 114A, a portion of the collective layer of adhesive 111A, a portion of the protective layer 116A and a portion of the collective encapsulation block 117A, corresponding to the location sites E.

In an equivalent manner to the preceding example and according to one variant embodiment, prior to it being spread out, the collective flexible sheet 114A may be coated on one face with the back protective layer 116A and, optionally, with a protective layer on its other face, so as to form a multilayer collective sheet to be spread out over the back collective region 110A.

What is claimed is:

1. A method for wafer-scale fabrication of electronic devices, comprising the following steps:
   a) mounting a plurality of electronic chips onto a mounting face of a collective substrate wafer, said electronic chips being separated from one another and positioned on location sites,
   b) extending a collective flexible sheet comprising at least one layer made of a heat-conductive material that contains pyrolytic graphite over a collective region running over the electronic chips and over the mounting face of the collective substrate wafer and between the electronic chips,
   c) compressing the collective flexible sheet in the direction of the collective region, and
   d) carrying out a dicing in order to obtain electronic devices respectively comprising at least one of the electronic chips, a portion of the collective substrate wafer corresponding to a location site and a portion of the collective flexible sheet corresponding to this location site.

2. The method according to claim 1, comprising the following step between the step a) and the step b): forming a collective encapsulation block filling, at least in part, gaps between the electronic chips, the collective region comprising at least a part of back faces of the electronic chips and a back face of the collective encapsulation block.

3. The method according to claim 1, comprising the following step between the step a) and the step b): forming encapsulation rings extending respectively around the electronic chips and over the mounting face of the substrate wafer, the collective region comprising at least a part of back faces of the electronic chips, at least a part of back faces of the encapsulation rings and at least a part of the mounting face of the collective substrate wafer which extend between the encapsulation rings.

4. The method according to claim 1, comprising the following step after the step b) or the step c): forming a collective encapsulation block on top of the flexible sheet.

5. The method according to claim 1, comprising the following step after the step b) or the step c): forming a collective protective layer on top of the collective flexible sheet.

6. The method according to claim 1, comprising the following step between the steps a) and b): forming a collective protective layer on top of the region.

7. The method according to claim 1, wherein the collective flexible sheet to be extended comprises the layer made of a heat-conductive material that contains pyrolytic graphite and a protective layer.

8. The method according to claim 1, wherein the collective flexible sheet to be extended comprises the layer made of a heat-conductive material that contains pyrolytic graphite interposed between two protective layers.

9. The method according to claim 8, wherein each protective layer exhibits a hardness greater than a hardness of the layer made of the heat-conductive material that contains pyrolytic graphite.

10. The method according to claim 8, comprising the following step: fixing the collective flexible sheet on top of the collective region by means of a collective layer of adhesive.

11. An electronic device, comprising:
    a substrate wafer having a mounting face,
    at least one electronic chip having a front face mounted onto the mounting face of the substrate wafer, and
    a flexible layer comprising at least one layer of a heat-conductive material that contains pyrolytic graphite, the flexible layer being situated on a region extending over a back face of the electronic chip and over the mounting face of the substrate wafer around the electronic chip.

12. The device according to claim 11, comprising a layer of adhesive between the flexible layer and the region.

13. The device according to claim 11, comprising a protective layer on top of the at least one layer of heat-conductive material that contains pyrolytic graphite.

14. The device according to claim 13, in which the protective layer exhibits a hardness greater than the hardness of the at least one layer of heat-conductive material that contains pyrolytic graphite.

15. The device according to claim 11, comprising a protective layer underneath the at least one layer of heat-conductive material that contains pyrolytic graphite.

16. The device according to claim 15, in which the protective layer exhibits a hardness greater than the hardness of the at least one layer of heat-conductive material that contains pyrolytic graphite.

17. The device according to claim 11, comprising an encapsulation block around the electronic chip and between the mounting face of the substrate wafer and the flexible layer, the region comprising the back face of the electronic chip and a back face of the encapsulation block.

18. The device according to claim 11, comprising an encapsulation ring extending around the electronic chip and over the mounting face of the substrate wafer, the region comprising the back face of the electronic chip, a back face of the encapsulation ring and a part of the mounting face of the substrate wafer surrounding the encapsulation ring.

19. The device according to claim 11, comprising an encapsulation block on top of the flexible layer.

* * * * *